United States Patent
Rush (12)

(10) Patent No.: US 6,193,459 B1
(45) Date of Patent: *Feb. 27, 2001

(54) INTEGRATED WAFER POD-LOAD/UNLOAD AND MASS-TRANSFER SYSTEM

(75) Inventor: John M. Rush, Mountain View, CA (US)

(73) Assignee: Fortrend Engineering Corp., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/267,432

(22) Filed: Mar. 12, 1999

Related U.S. Application Data

(63) Continuation of application No. 09/038,809, filed on Mar. 11, 1998, now Pat. No. 5,885,045.
(60) Provisional application No. 60/039,332, filed on Mar. 17, 1997.

(51) Int. Cl.[7] .................................................. B65G 65/00
(52) U.S. Cl. .......................... 414/417; 414/938; 414/940; 414/217.1; 104/35
(58) Field of Search ............................ 414/744.1, 744.2, 414/800, 810, 811, 222.01, 403, 416, 417, 225.01, 226.01, 254, 226.02, 283, 229, 940, 939, 938, 935, 936, 217, 217.1; 118/719; 104/35, 36; 432/239

(56) References Cited

U.S. PATENT DOCUMENTS

| 4,776,744 | 10/1988 | Stonestreet et al. | 414/217 |
| 4,840,530 | 6/1989 | Nguyen | 414/404 |
| 5,570,990 | 11/1996 | Bonora et al. | 414/543 |
| 5,613,821 | 3/1997 | Muka et al. | 414/416 |
| 5,630,690 | 5/1997 | Salzman | 414/938 |
| 5,658,123 | 8/1997 | Goff et al. | 414/786 |

FOREIGN PATENT DOCUMENTS

| 0552756 | 7/1993 | (EP) | 414/940 |

*Primary Examiner*—Frank E. Werner
(74) *Attorney, Agent, or Firm*—Donald E. Schreiber

(57) ABSTRACT

A system includes an interface for receiving a pod having a carrier that receives wafers, and that is initially enclosed within a base and a pod cover. The system also includes a mechanism that transfers an exposed carrier between the interface and a platform of a mass-transfer machine included in the system. The machine includes a gantry arm for transferring the carrier between the platform and a transfer station. A retainer assembly is positionable over the carrier at the transfer station, and over a process carrier that is used in a processing tool. Moveable retainers of the assembly receive and hold wafers. The machine includes an elevator that moves between the transfer station and the process carrier. The elevator extends and retracts for transferring wafers between the retainers and either the carrier or the process carrier. A turntable, that receives the process carrier, permits automatically reorienting wafers.

24 Claims, 8 Drawing Sheets

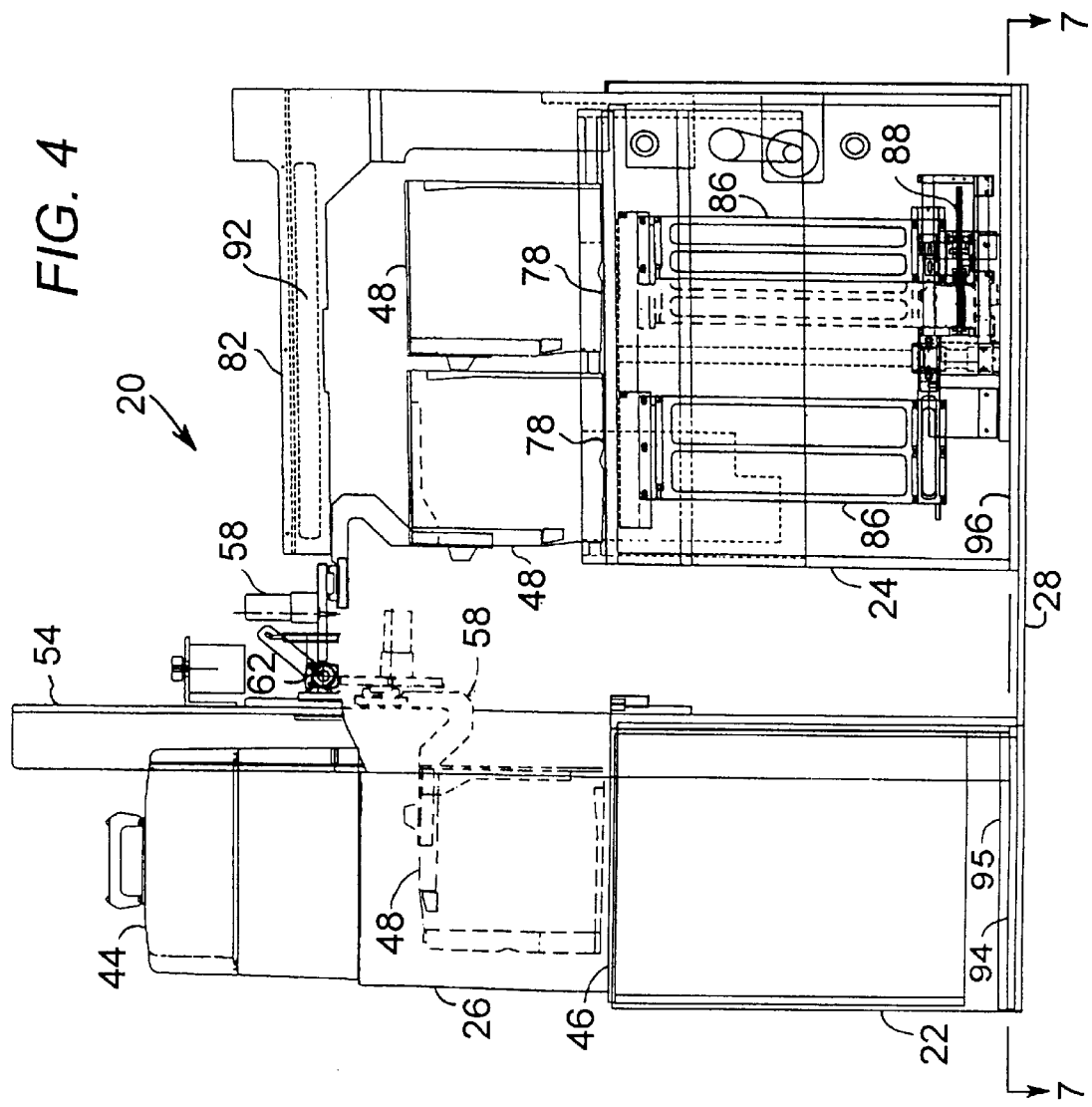

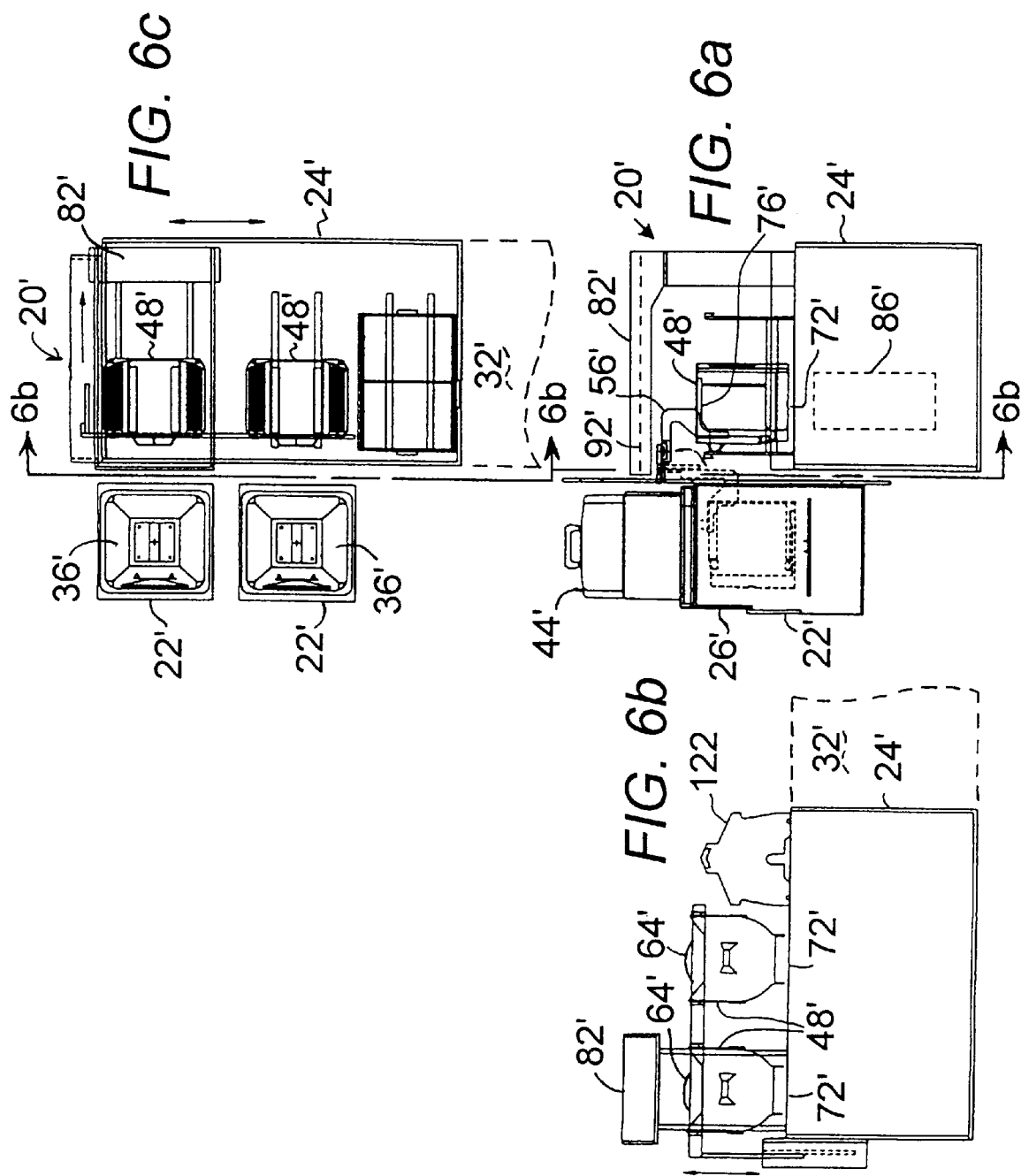

INTEGRATED WAFER POD-LOAD/UNLOAD AND MASS-TRANSFER SYSTEM

CLAIM OF PROVISIONAL APPLICATION RIGHTS

This application claims the benefit of U.S. Provisional Patent Application No. 60/039,332 on Mar. 17, 1997, and is a continuation of application Ser. No. 09/038,809 filed Mar. 11, 1998, which issued Mar. 9, 1999, as U.S. Pat. No. 5,885,045.

BACKGROUND OF THE INVENTION

1. Field of the Invention

The present invention relates generally to silicon wafer handling machines, and more particularly to systems adapted for automatically unloading silicon wafers from a Standard Mechanical InterFace ("SMIF") pod and then transferring such wafers to a process carrier, and conversely.

2. Description of the Prior Art

Certain semiconductor wafer processing operations require that a number of disk-shaped silicon wafers be loaded into a process carrier arranged in a vertical orientation. Examples of such processes are "wet bench" processing and horizontal diffusion furnace processing. Presently, silicon wafers are transported between processing tools in a SMIF pod which orients the wafers horizontally. Accordingly, in addition to transferring wafers between the SMIF pod and the process carrier, performing any wafer processing operation in which the wafers must be oriented vertically requires reorienting the wafers from their horizontal orientation in the SMIF pod into a vertical orientation in the process carrier. In addition to reorientation of wafers between the SMIF pod and the process carrier, frequently the process carrier is capable of holding more wafers than the SMIF pod. Accordingly, in general preparing wafers for a process in which they are vertically oriented requires:

1. removing a SMIF pod's wafer carrier from within the protective environment provided by the SMIF pod;
2. removing the wafers from the SMIF pod's wafer carrier;
3. rotating the wafers from a horizontal to a vertical orientation either while they are present in, or after they are removed from, the SMIF pod's wafer carrier;
4. depositing the now vertically oriented wafers into a process carrier; and
5. perhaps performing the preceding operations more than once to combine wafers from more than one SMIF pod's wafer carrier into one process carrier.

To prevent contamination of silicon wafers during processing, present semiconductor processing technology requires that all of the preceding operations be performed automatically by a machine without human intervention in the process. Thus far, automation of this wafer handling process has been achieved by cascading a general purpose SMIF pod-load interface apparatus with a wafer mass-transfer machine with a process tool, e.g. a wet bench or a horizontal diffusion furnace. Assembling an entire apparatus for either of these process tools therefore results in two mechanical interfaces, i.e. the mechanical interface between the SMIF pod-load interface apparatus and the wafer mass-transfer machine, and the mechanical interface between the wafer mass-transfer machine and the process tool. Alignment of a mechanical interface, e.g. the mechanical interface between the SMIF pod-load interface apparatus and the wafer mass-transfer machine, can be so difficult that after the two devices have been disconnected, perhaps for repair or maintenance, several hours may be required to properly realign them.

In addition to the mechanical interfaces, there also exist electrical interfaces between the SMIF pod-load interface apparatus and a wafer mass-transfer machine, and the wafer mass-transfer machine with the process tool. In particular, the electrical interfaces between each of the devices must be arranged so the combined devices operate in a coordinated manner. Interfacing the SMIF pod-load interface apparatus with the wafer mass-transfer machine has proven to be troublesome and particularly annoying for process tool manufacturers desirous of selling an integrated system which includes the SMIF pod-load interface, the wafer mass-transfer machine, and the process tool.

In addition to the difficulties associated with interfacing the SMIF pod-load interface apparatus with the wafer mass-transfer machine, the combined devices occupy more floor space than desirable, and operate comparatively slowly because they are general purpose rather than special purpose devices. For example, a standard pod load interface opens a SMIF pod and transfers the wafer carrier to the process tool. For certain processes, the wafers must also be transferred from the original carrier to a different carrier. Under such circumstances, a wafer transfer machine has to be combined with a pod load interface to translate a carrier from a position within the pod load interface to a position within the wafer mass-transfer machine. For translating the SMIF pod's wafer carrier from one location to another location, generally the pod load interface includes an arm having at least two rotary joints which merely picks up the SMIF pod's wafer carrier, translates the carrier to a new location, and then set the SMIF pod's wafer carrier down. Accordingly, if the pod load interface is to also reorient the wafers from a horizontal orientation to a vertical orientation, an end-effector must be added to the standard pod load interface for performing the prescribed rotation.

In addition, the combined SMIF pod-load interface apparatus and wafer mass-transfer machine unnecessarily replicate certain subsystems. For example, a general purpose SMIF pod-load interface and a wafer mass-transfer machine each includes an environmental control system to prevent wafer contamination. Similarly, the SMIF pod load/unload device and wafer mass-transfer machine each include a separate electronic circuit for controlling their respective operation.

In addition to a horizontal orientation for the silicon wafers within the SMIF pod, it is often desirable to arrange the wafers with the backside of one wafer facing the frontside of the immediately adjacent wafer, or conversely. Generally, the backside of a silicon wafer is more likely to be contaminated than the wafer's frontside. Therefore, during wafer processing in which the wafers retain their SMIF pod's wafer carrier arrangement, contamination of the frontside of a wafer is more likely than if the wafers were arranged backside-to-backside and frontside-to-frontside. Such a rearrangement of the wafers into the more desirable backside-to-backside and frontside-to-frontside orientation is difficult to achieve with the combined SMIF pod-load interface apparatus and wafer mass-transfer machine.

SUMMARY OF THE INVENTION

An object of the present invention is to provide an integrated wafer pod-load/unload and mass-transfer system having higher throughput.

Another object of the present invention is to provide an integrated wafer pod-load/unload and mass-transfer system that reduces mechanical interfaces.

Another object of the present invention is to provide an integrated wafer pod-load/unload and mass-transfer system that eliminates electrical interface problems between the wafer transfer machine and the pod loader.

Another object of the present invention is to provide an integrated wafer pod-load/unload and mass-transfer system having lower cost.

Another object of the present invention is to provide an integrated wafer pod-load/unload and mass-transfer system that loads faster.

Another object of the present invention is to provide an integrated wafer pod-load/unload and mass-transfer system that occupies less floor space.

Another object of the present invention is to provide an integrated wafer pod-load/unload and mass-transfer system that can provide back-to-back silicon wafer loading into a process carrier.

Briefly, the present invention integrates a SMIF pod loader, a wafer transfer machine, and mini-environment into a single system. For exchanging wafers between a carrier contained in a SMIF pod and a process carrier, the integrated wafer pod-load/unload and mass-transfer system links directly to a process tool. The pod load interface maintains an ultra clean environment for silicon wafers, and provides an ergonomic load port platform height for operator manual pod loading. A common operator panel is used to control all aspects of the process tool operation. The electronic controls are shared between several robotic elements.

The integrated pod-load/unload and mass-transfer system in accordance with the present invention automatically transfers silicon wafers between a SMIF pod and a wafer processing tool. As is known to those skilled in the art, the SMIF pod includes a wafer carrier adapted to receive a plurality of wafers. A base of the SMIF pod receives the wafer carrier and a SMIF pod cover mates with and seals to the base of the SMIF pod. In this way, the SMIF pod's cover and base completely enclose the SMIF pod's wafer carrier and any wafers carried therein.

The pod-load/unload and mass-transfer system itself includes a pod loader interface adapted to receive the SMIF pod, and either to expose or to reenclose the SMIF pod's wafer carrier. The pod-load/unload and mass-transfer system also includes a carrier load mechanism that is mechanically coupled to the pod loader interface. The carrier load mechanism transfers the SMIF pod's wafer carrier between a position in which the wafer carrier is exposed within the pod loader interface and a load platform.

Also included in pod-load/unload and mass-transfer system is a mass-transfer machine that includes the load platform. The mass-transfer machine, which is mechanically coupled directly to the pod loader interface, includes a gantry arm for transferring the wafer carrier between the load platform and a first wafer transfer station included in the mass-transfer machine. A retainer assembly, also included in the mass-transfer machine is positionable over either the SMIF pod's wafer carrier, when the wafer carrier is present at the wafer transfer station, and over a process carrier used in the wafer processing tool. The retainer assembly includes moveable retainers adapted for receiving and holding wafers. The mass-transfer machine includes at least one elevator moveable between positions in which the elevator is located either beneath the wafer transfer station or beneath the process carrier. The elevator extends and retracts for transfer-ring silicon wafers either between the wafer carrier present at the wafer transfer station and a position within the retainer assembly in which the retainers thereof may receive the wafers, or between the process carrier and a position within the retainer assembly in which the retainers thereof may receive the wafers. one embodiment of the present invention includes motorized turntable that receives the process carrier. The motorized turntable used in combination with the wafer elevators and the retainer assembly permits automatically reorienting the silicon wafers from a frontside-to-backside orientation to a backside-to-backside and frontside-to-frontside orientation.

These and other features, objects and advantages will be understood or apparent to those of ordinary skill in the art from the following detailed description of the preferred embodiment as illustrated in the various drawing figures.

BRIEF DESCRIPTION OF THE DRAWINGS

FIG. 4 is the side elevational view of the integrated wafer pod-load/unload and mass-transfer system of FIG. 1 depicting a mini-environment for enclosing a SMIF pod's wafer carrier, two carriers loaded onto the wafer transfer machine, and is partially cut-away along a line 4—4 in FIG. 3 to illustrate operation of a carrier load mechanism;

FIGS. 6a through 6c respectively are side elevational, front elevational, and plan views of an alternative embodiment integrated wafer pod-load/unload and mass-transfer system with the front elevational view 6b being taken along the line 6b—6bin FIGS. 6a and 6c;

DETAILED DESCRIPTION OF THE PREFERRED EMBODIMENT

Figure 1:
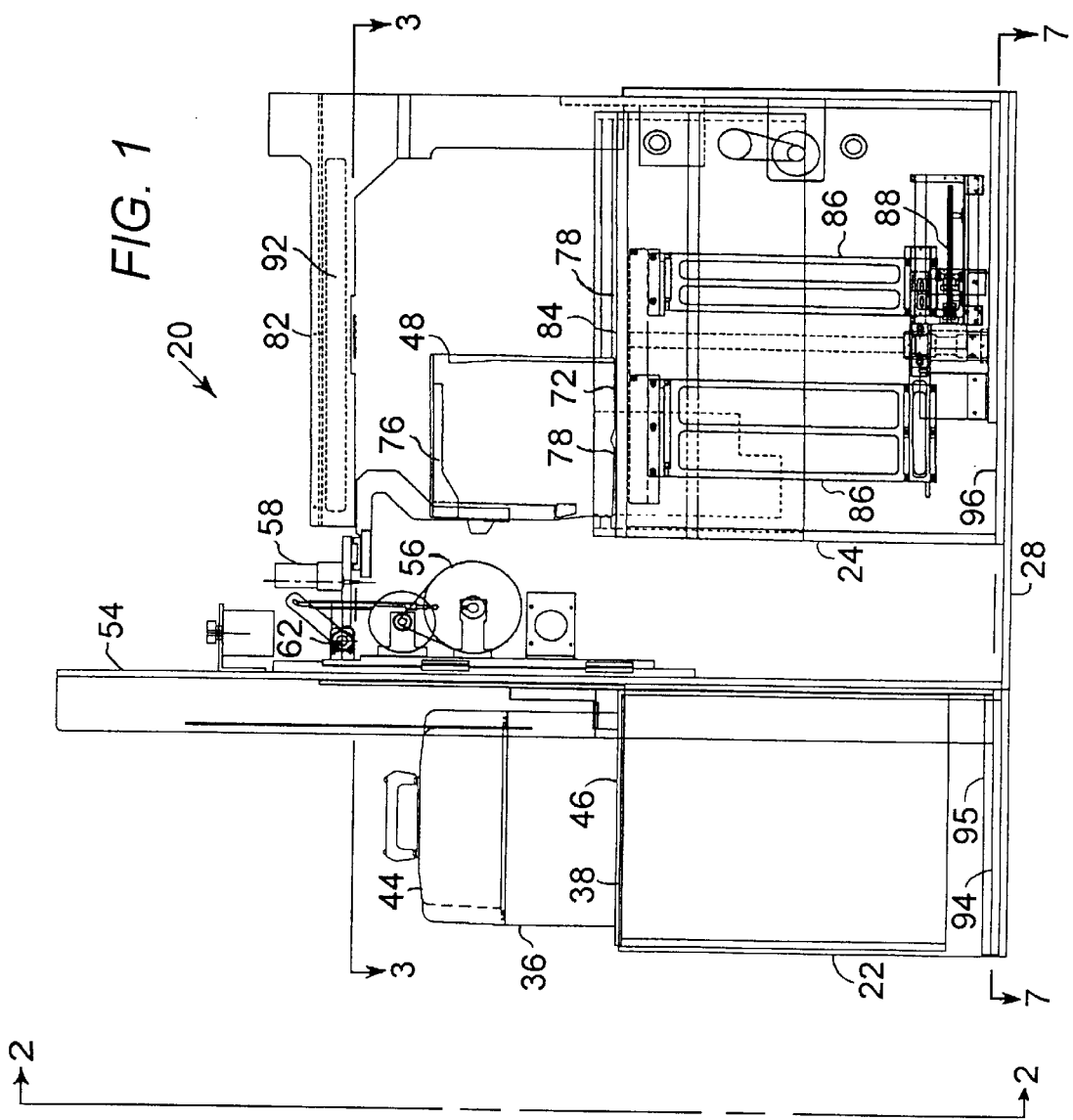
FIG. 1 is a side elevational view of an integrated wafer pod-load/unload and mass-transfer system in accordance with the present invention depicting a pod load interface on which rests a SMIF pod, a SMIF pod's wafer carrier unloaded from the SMIF pod and resting on a load platform of a wafer transfer machine, and a mounting plate to which both the wafer pod-load/unload device and the mass-transfer machine are secured.
Figure 2:
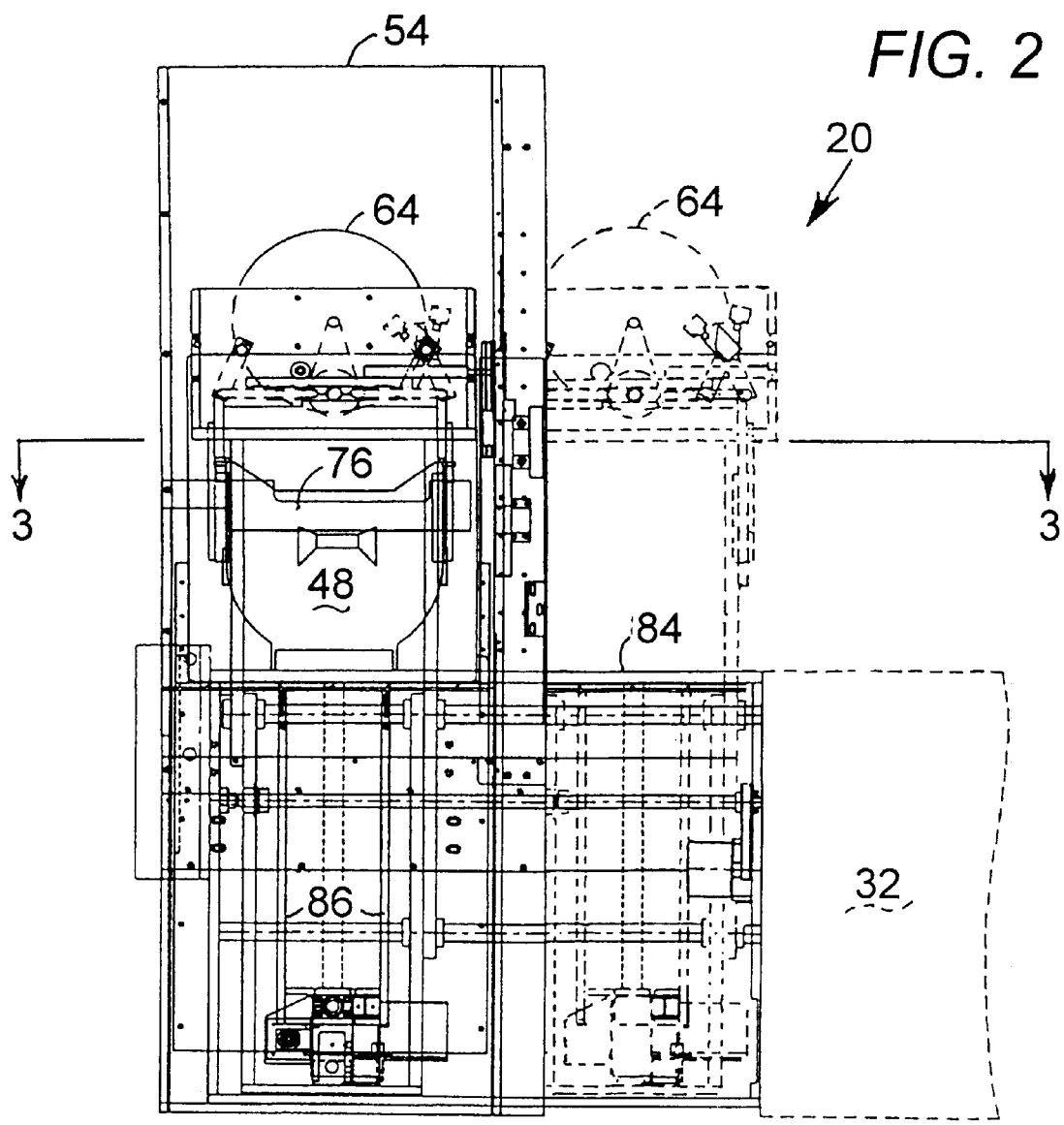
FIG. 2 is a front elevational view of the integrated wafer pod-load/unload and mass-transfer system taken along the line 2—2 in FIG. 1.
Figure 3:
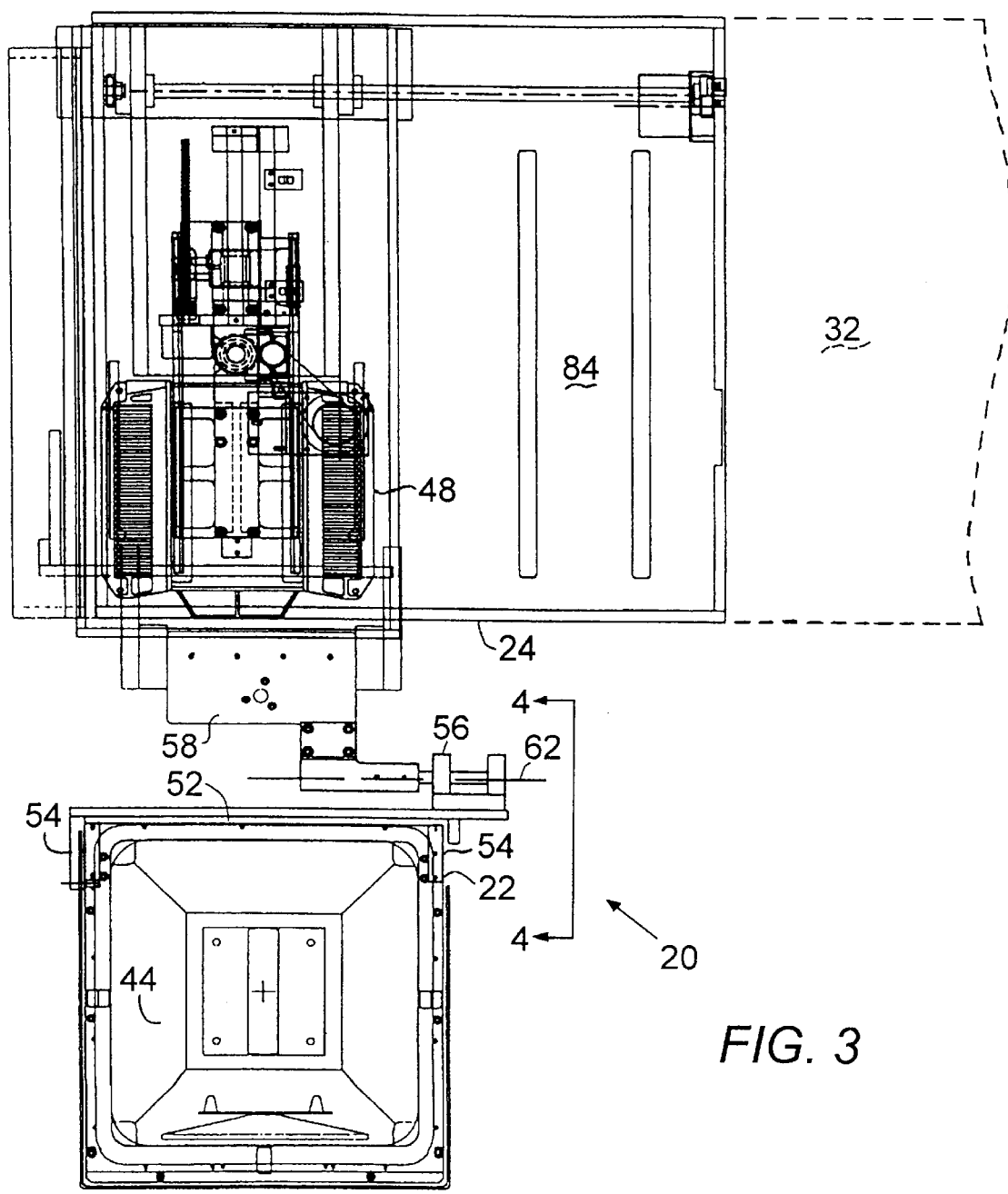
FIG. 3 is a plan view of the integrated wafer pod-load/unload and mass-transfer system taken along the line 3—3 in FIGS. 1 and 2.
Figure 5A:
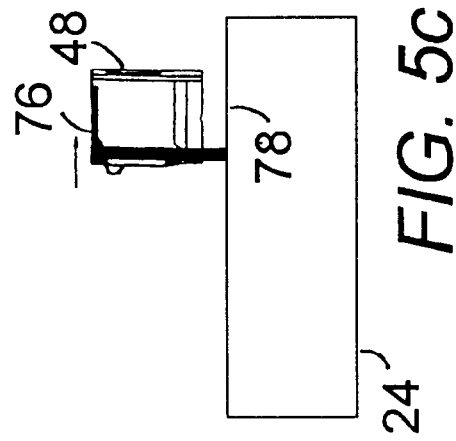
FIGS. 5a–5e are schematic diagrams forming a sequence that illustrates transfer of a SMIF pod's wafer carrier from one location to another within the wafer transfer machine by a gantry included in the integrated wafer pod-load/unload and mass-transfer system.
Figure 5B:
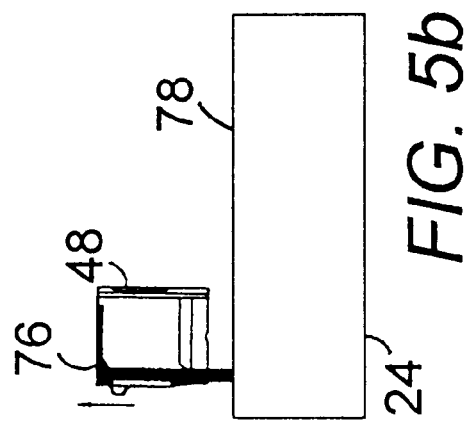
Figure 5C:
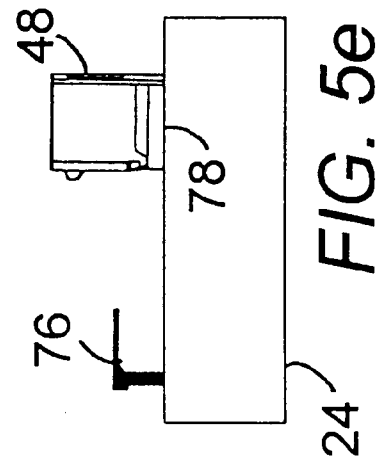
Figure 5D:
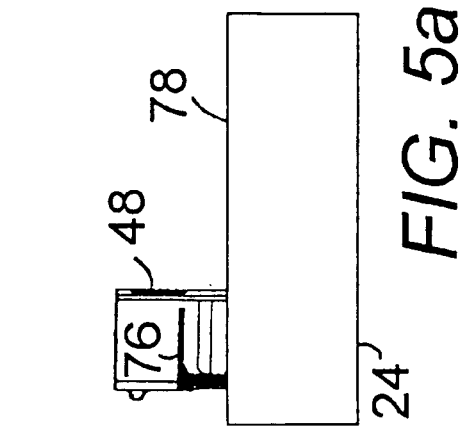
Figure 5E:
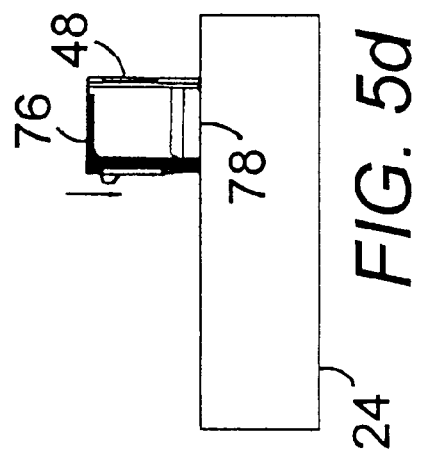

FIGS. 1–4 depict different views of an integrated wafer pod-load/unload and mass-transfer system in accordance with the present invention referred to by the general reference character 20. The system 20 includes a SMIF pod-load interface 22, a wafer mass-transfer machine 24, a mini-environment 26 and an L-shaped mounting plate 28. As illustrated with dashed lines in FIGS. 2 and 3, the system 20 abuts a process tool 32 which may be a "wet bench" for liquid immersion processing of silicon wafers, a horizontal diffusion furnace, or any other processing tool which requires vertically oriented wafers. The process tool 32 includes a robot arm (not depicted in any of the FIGS.) that positions a process carrier (also not depicted in FIGS. 1–4) onto the wafer mass-transfer machine 24 either to receive wafers from, or deliver wafers to, the system 20.

As illustrated in FIGS. 1 and 4, the SMIF pod-load interface 22 receives a SMIF pod 36 onto a loading platform 38. The pod load interface includes a pod present sensor (not separately depicted in any of the FIGS.) for detecting arrival or removal of a pod. The SMIF pod-load interface 22 includes a motorized pod opener mechanism (not separately depicted in any of the FIGS.). To open the SMIF pod 36, the pod opener mechanism releases a SMIF cover 44 from a SMIF base 46, and then raises the SMIF cover 44 above a SMIF pod's wafer carrier 48 carried within the SMIF pod 36 while concurrently enclosing the SMIF pod's wafer carrier 48 within the mini-environment 26. An optical sensor (not separately depicted in any of the FIGS. and distinct from the pod present sensor described above) detects the presence of the SMIF pod's wafer carrier 48 in the SMIF pod 36. When the SMIF cover 44 is raised, the SMIF pod's wafer carrier 48 remains within the mini-environment 26 to be thereby maintained in a class 1 environment. The SMIF pod's wafer carrier 48 in each SMIF pod 36 holds twenty-five (25) silicon wafers that are oriented horizontally. The SMIF pod-load interface 22 is similar to that described in U.S. patent application Ser. No. 08/400,039 filed Mar. 7, 1995, in the name of John Rush, that is entitled "Pod Loader Interface," and that is hereby incorporated by reference.

A window 52, that pierces a pod-loader-interface bulkhead 54, permits a motorized carrier load mechanism 56 to access the SMIF pod's wafer carrier 48. The carrier load mechanism 56 which is supported from the bulkhead 54, and includes an end-effector 58 that rotates about a horizontal axis 62 to thereby enter through the window 52 into the mini-environment 26. After entering the mini-environment 26, the end-effector 58 engages the SMIF pod's wafer carrier 48. The end-effector 58 then raises the SMIF pod's wafer carrier 48 off guides (not separately depicted in any of the FIGS.), and carrying the SMIF pod's wafer carrier 48 rotates in the reverse direction about the horizontal axis 62 thereby withdrawing out of the window 52 so wafers 64 in the SMIF pod's wafer carrier 48 become oriented vertically over the wafer mass-transfer machine 24. The end-effector 58 then deposits the SMIF pod's wafer carrier 48, about the center of gravity of the SMIF pod's wafer carrier 48, onto a load platform 72 of the wafer mass-transfer machine 24. Dedicating the carrier load mechanism 56 to transferring the SMIF pod's wafer carrier 48 between the SMIF pod-load interface 22 and the wafer mass-transfer machine 24 results in a simple mechanism that operates much more swiftly than previous systems.

Directly coupling the SMIF pod-load interface 22 to the wafer mass-transfer machine 24 reduces errors caused by mechanical interfaces between two independent units. The SMIF pod-load interface 22 and the wafer mass-transfer machine 24 also share common control electronics thereby eliminating potential software communications problems.

The wafer mass-transfer machine 24 transfers wafers 64 from SMIF pods' wafer carriers 48 to a process carrier used in the process tool 32. The wafer mass-transfer machine 24 includes a motorized gantry arm 76 that, as illustrated in FIGS. 5a–5e, rises to pick-up the SMIF pod's wafer carrier 48 resting on the load platform 72, and transports the SMIF pod's wafer carrier 48 horizontally away from the SMIF pod-load interface 22 to transfer stations 78 of the wafer mass-transfer machine 24. The system 20 can be configured so the gantry arm 76 transports the SMIF pod's wafer carrier 48 different distances within the wafer mass-transfer machine 24 as required for compatibility with process carrier of the process tool 32.

The SMIF pod-load interface 22 and the gantry arm 76 illustrated in FIGS. 1–4 may load one or preferably two SMIF pods' wafer carriers 48 onto the wafer mass-transfer machine 24 at transfer stations 78 as illustrated in FIG. 4. After the SMIF pods' wafer carriers 48 are located in the transfer stations 78, a motorized retainer assembly 82, that is elevated above the SMIF pods' wafer carriers 48, moves horizontally across a fixed top plate 84 of the wafer mass-transfer machine 24 to a position over the SMIF pods' wafer carriers 48. Dual pedestal, U-shaped, motorized wafer elevators 86 then rise through the top plate 84 to lift the wafers 64 out of the SMIF pods' wafer carriers 48 up to the retainer assembly 82. If necessary, after the wafer elevators 86 raises the wafers 64 above the SMIF pods' wafer carriers 48 but before elevating them to the retainer assembly 82, a motorized indexing mechanism 88 moves the wafer elevator 86 furthest from the SMIF pod-load interface 22 horizontally toward or away from the SMIF pod-load interface 22. Moving the wafer elevator 86 horizontally adjusts the position of the wafers 64 lifted out of the SMIF pod's wafer carrier 48 furthest from the wafer mass-transfer machine 24 to match the requirements of the process carrier of the process tool 32. A pair of elongated motorized retainers 92 carried within and extending almost the entire length of the retainer assembly 82 then rotate under the wafers 64, then supported on the wafer elevators 86, to receive the wafers 64. The wafer elevators 86 then retract downward beneath the top plate 84, and the retainer assembly 82 now carrying the wafers 64 moves horizontally across the top plate 84 to position the wafers 64 over the process carrier of the process tool 32. The wafer elevators 86 again rise to pick-up the wafers 64, the retainers 92 then retract, and the wafer elevators 86 then descend to deposit the wafers 64 into the process carrier. The robot arm included in the process tool 32 then transfers the process carrier carrying the wafers 64 into the process tool 32 for processing. Operating in the manner described thus far, the system 20 may load up to fifty (50) wafers 64 at a time from two (2) SMIF pods' wafer carriers 48 into a single process carrier.

After the wafers 64 undergo processing in the process tool 32, a reverse sequence of operations removes the wafers 64 from the process carriers and stores them back into the SMIF pod 36.

Figure 7:
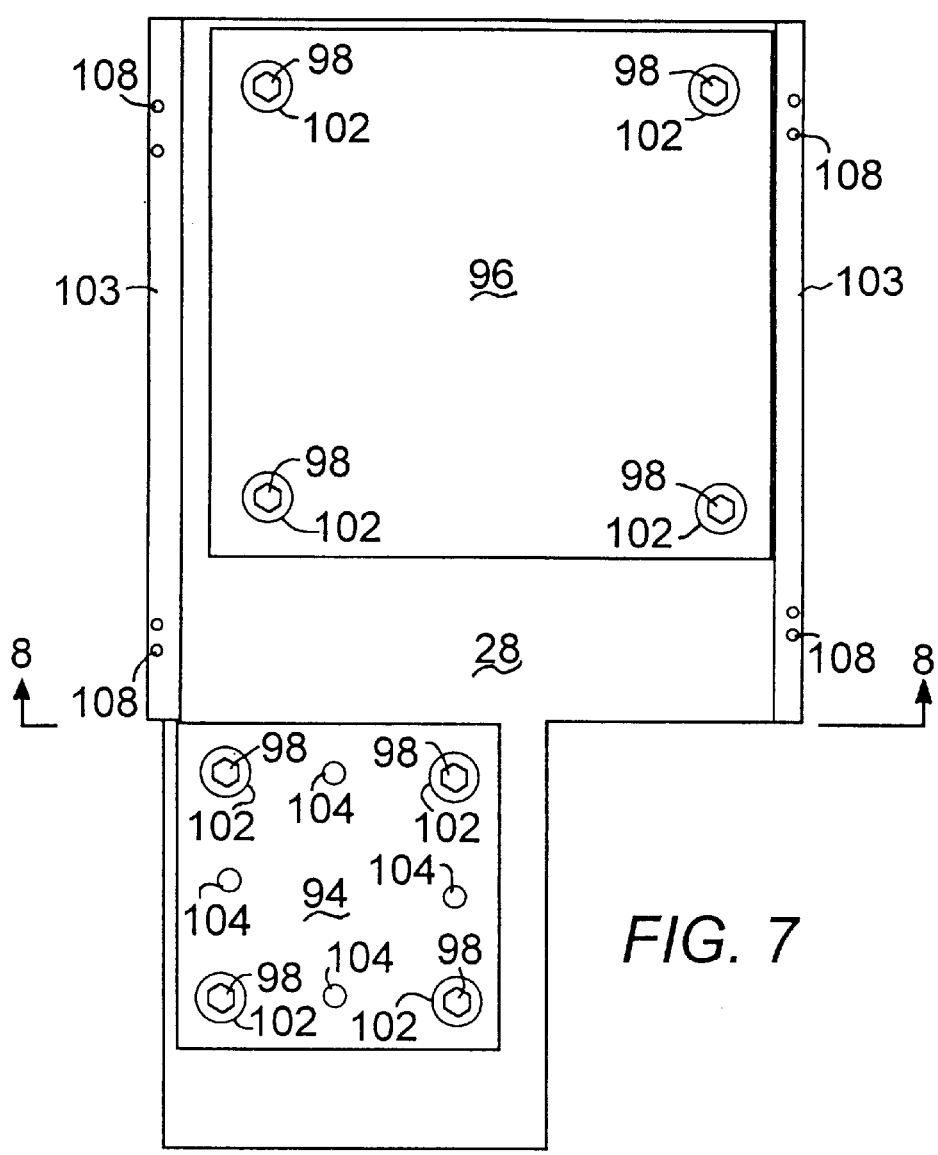
FIG. 7 is a plan view of the mounting plate depicted in FIG. 1.

FIG. 7 illustrates the L-shaped mounting plate 28 upon which rest both an intermediate plate 94 for the SMIF pod-load interface 22, and a base plate 96 for the wafer mass-transfer machine 24. To facilitate radial alignment of the base plate 96 to the process tool 32, the base plate 96 is secured to the L-shaped mounting plate 28 by threaded bolts 98 which pass through large apertures piercing the base plate 96 to screw into mating threaded holes in the L-shaped mounting plate 28. A large washer 102 is interposed between the head of each bolt 98 and the base plate 96. In a similar manner, the intermediate plate 94 is also secured to the L-shaped mounting plate 28 using bolts 98 passing through large apertures piercing the intermediate plate 94 and by large washers 102 that encircle the bolts 98. Both the intermediate plate 94 and a base plate 95 of the SMIF pod-load interface 22 are joined together by guide pins 104 that fit into apertures piercing the intermediate plate 94 and the base plate 95. The guide pins 104 ensure accurate repositioning of the SMIF pod-load interface 22 on the L-shaped mounting plate 28 after removal therefrom for repair or maintenance.

Figure 8:
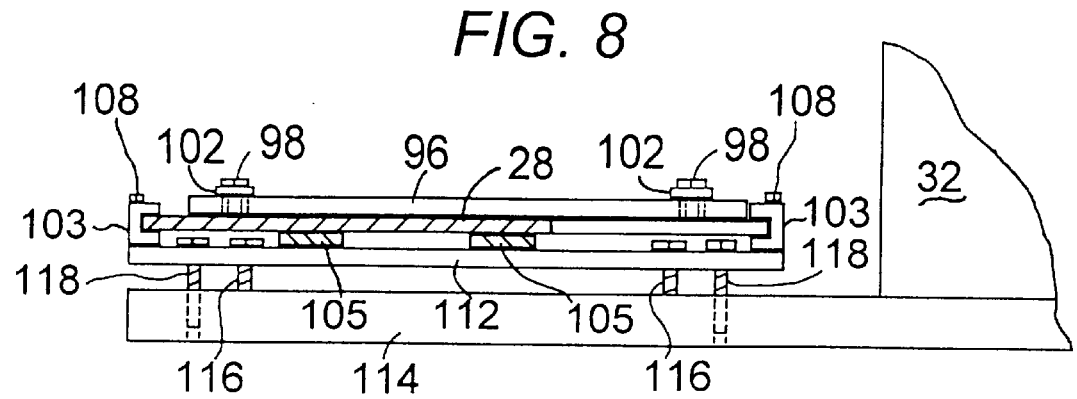
FIG. 8 is a partially cross-sectioned front elevational view of the mounting plate taken along the line 8—8 in FIG. 7.

Referring now to FIG. 8, the L-shaped mounting plate 28 rests upon a pair of guide rails 103 that extend along sides of the L-shaped mounting plate 28. A pair of stiffeners 105, secured to the L-shaped mounting plate 28 beneath the L-shaped mounting plate 28, extend from below the wafer mass-transfer machine 24 to below the SMIF pod-load interface 22 to support and stiffen that portion of the L-shaped mounting plate 28 which projects outward beyond the guide rails 103. Supporting the L-shaped mounting plate 28 on the guide rails 103 permits sliding the entire system 20 forward or backward horizontally with respect to the process tool 32 to facilitate maintenance or repair. Bolts 108 lock the system 20 to the guide rails 103 during normal operation. The guide rails 103 rest upon and are secured to an interface plate 112. The interface plate 112 in turn is supported from a frame 114 of the process tool 32 by four threaded jack screws 116, only two of which appear in FIG. 8. Four threaded bolts 118, only two of which appear in FIG. 8, pass through apertures piercing the interface plate 112 to secure the interface plate 112 to the frame 114. Adjustment of the jack screws 116 permits lowering the interface plate 112 toward or raising the interface plate 112 away from the frame 114. In this way, the system 20 may be raised, lowered and tilted with respect to the process tool 32 both parallel to the process tool 32 and orthogonal to the process tool 32. The adjustments permitted by this structure facilitate aligning the mechanical interface between the system 20 and the process tool 32 both radially and rectilinearly.

FIGS. 6a–6c depict an alternative embodiment of the system 20 that includes two (2) SMIF pod-load interfaces 22. Those elements depicted in FIGS. 6a–6c that are common to the system 20 depicted in FIGS. 1–5 carry the same reference numeral distinguished by a prime ("'") designation. The two (2) SMIF pod-load interfaces 22' and carrier load mechanisms 56' of the alternative embodiment system 20' respectively transfer SMIF pods' wafer carriers 48' onto two (2) load platforms 72' of the wafer mass-transfer machine 24'. Similar to the system 20, a single gantry arm 76' of the wafer mass-transfer machine 24' appropriately position the SMIF pods' wafer carriers 48' horizontally with respect to the SMIF pod-load interfaces 22' over the wafer elevator 86'. However, the system 20' locates the wafers 64' in the SMIF pods' wafer carriers 48' from one of the SMIF pod-load interface 22' half-way between the wafers 64' in the SMIF pods' wafer carriers 48' from the other SMIF pod-load interface 22'.

With the wafers 64' from the two SMIF pod-load interfaces 22' located half-way between each other, similar to the system 20, the wafer elevator 86' then lifts the wafers 64' out of the SMIF pods' wafer carriers 48' up to the retainer assembly 82'. However, instead of a single pair of retainers 92 as in the system 20, the retainer assembly 82' of the system 20' includes two (2) pairs of intermeshing retainers 92' that are adapted to hold the wafers 64' from both of the SMIF pod-load interfaces 22' at a pitch, i.e. spacing between immediately adjacent wafers 64', that is one-half of the pitch between immediately adjacent wafers 64' in the SMIF pods' wafer carriers 48'. In this way, the system 20' combines on the retainer assembly 82' the twenty-five (25) wafers 64' from four (4) SMIF pods' wafer carriers 48' into a single group of one hundred (100) wafers 64' for loading into a process carrier 122.

Figure 9:
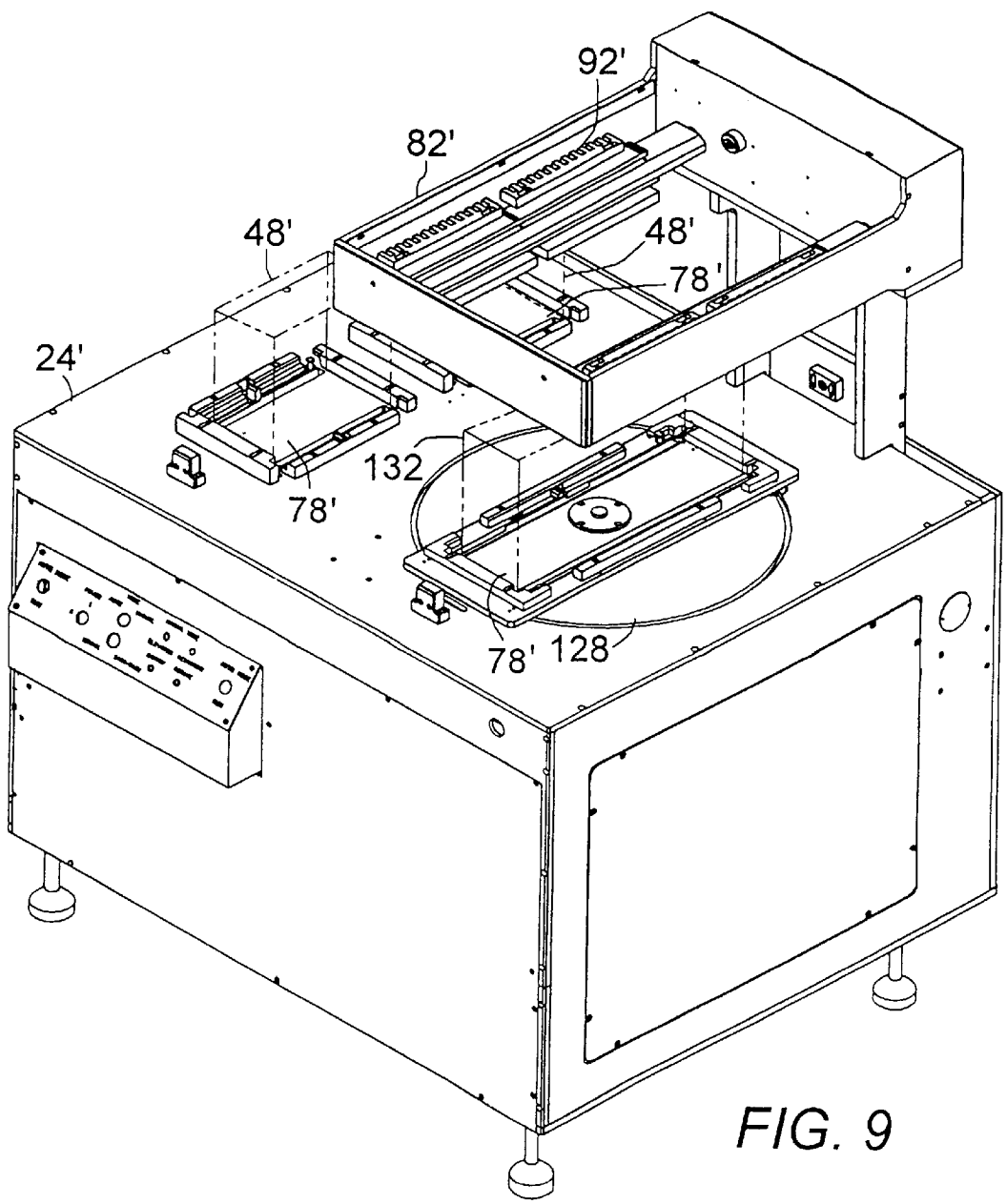
FIG. 9 is a perspective view showing the retainer assembly and retainer arm which takes wafers in a horizontal array from two wafer carriers (each holding up to twenty-five wafers) at one loading platform and transfers the wafers to a larger carrier (holding up to fifty wafers) at another platform arranging the wafers in a backside-to-backside and frontside-to-frontside orientation.

As illustrated in FIG. 9, the mass-transfer machine 24' may also include a motorized turntable 128 at one of three (3) transfer stations 78' for reversing the direction of a larger wafer carrier 132 resting thereupon. As described in greater detail below, inclusion of the motorized turntable 128 in the mass-transfer machine 24' permits automatic reorientation of wafers from two (2) SMIF pods' wafer carriers 48 into a backside-to-backside and frontside-to-frontside orientation within the single wafer carrier 132. To effect such a reorientation of the wafers, first two SMIF pods' wafer carriers 48' are deposited respectively onto two (2) of the transfer stations 78 from a SMIF pod-load interface, not depicted in FIG. 9. After the SMIF pods' wafer carriers 48' are present on the transfer stations 78', the motorized retainer assembly 82', moves horizontally to a position above the SMIF pods' wafer carriers 48'. Analogously to the description set forth above in connection with FIGS. 1–4, notorized wafer elevators then rise to lift the wafers out of the SMIF pods' wafer carriers 48' up to the retainer assembly 82'. Two pairs of elongated motorized retainers 92', carried within and occupying almost the entire length of the retainer assembly 82', then rotate under the wafers to receive the wafers. As described above, while the wafers 64 are being raised toward the retainer assembly 82' the wafer elevators move closer together to match the pitch of all the wafers carried by the retainer assembly 82' with the pitch of the wafer carrier 132. The wafer elevators then retract downward beneath the transfer stations 78', and both the elevators and the retainer assembly 82' now carrying as many as fifty (50) wafers move horizontally across the mass-transfer machine 24' to align with the wafer carrier 132.

With the wafers now disposed in the retainer assembly 82' over the motorized turntable 128, a wafer elevator included therein rises to receive from alternating locations along the retainers 92' as many as twenty-five (25) of the wafers, i.e. twelve (12) from one of the SMIF pod's wafer carrier 48' and thirteen (13) from the other SMIF pod's wafer carrier 48' or the converse. The elevator, carrying up to twenty-five (25) wafers, then descends into the mass-transfer machine 24 thereby depositing the wafers into the wafer carrier 132. After the wafers are deposited in the wafer carrier 132, the motorized turntable 128 rotates 180° so the frontsides of the wafers in the wafer carrier 132 face the backsides of the wafers still remaining above in the retainer assembly 82'. The wafer elevator carrying the now reoriented wafers again rises to the retainer assembly 82' to receive the wafers remaining there. Carrying all the wafers now arranged in a backside-to-backside and frontside-to-frontside orientation, the elevator again descends into the mass-transfer machine 24' to deposit the reoriented wafers into the wafer carrier 132. A robot arm included in a process tool then transfers the wafer carrier 132 and the reoriented wafers into the tool for processing. As described above, organizing wafers backside-to-backside and frontside-to-frontside within the wafer carrier 132 for processing within the process tool eliminates transfer of contamination from the backside of one wafer to the frontside of the immediately adjacent wafer.

After the wafers have been processed in the tool, reversing the sequence of operations describe above transfers the wafers from the wafer carrier 132 back into the SMIF pods' wafer carriers 48' restoring all of the wafers to a uniform orientation.

Although the present invention has been described in terms of the presently preferred embodiment, it is to be understood that such disclosure is purely illustrative and is not to be interpreted as limiting. Consequently, without departing from the spirit and scope of the invention, various alterations, modifications, and/or alternative applications of the invention will, no doubt, be suggested to those skilled in the art after having read the preceding disclosure.

What is claimed is:

1. An integrated pod-load/unload and mass-transfer system for automatically transferring wafers between a Standard Mechanical InterFace ("SMIF") pod and a carrier used in wafer processing; the SMIF pod including:

a wafer carrier adapted to receive a plurality of wafers;

a base which receives the wafer carrier; and a pod cover which mates with and seals to the base of the SMIF pod thereby enclosing the wafer carrier and any wafers received therein within the pod cover and the base;

the pod-load/unload and mass-transfer system comprising:

pod loader interface adapted for receiving the SMIF pod, for exposing a wafer carrier initially enclosed within the SMIF pod, and for reenclosing the wafer carrier within the SMIF pod, said pod loader interface including a bulkhead that is pierced by a window;

a carrier load mechanism that is mechanically coupled to said pod loader interface and is supported from the bulkhead, a portion of said carrier load mechanism entering into and withdrawing out of the window of the bulkhead while said carrier load mechanism transfers the wafer carrier between a position in which the wafer carrier is exposed within said pod loader interface and a wafer transfer station; and a mass-transfer machine that includes the wafer transfer station and which is mechanically coupled directly to said pod loader interface, said mass-transfer machine including:

a retainer assembly positioned over the wafer carrier when the wafer carrier is present at the wafer transfer station, said retainer assembly including moveable retainers adapted for receiving wafers; and an elevator that is both:

extensible for transferring wafers between a wafer carrier present at the wafer transfer station and a position within said retainer assembly in which the retainers thereof may receive the wafers; and retractable for transferring wafers between the retainers of the retainer assembly which have received wafers and a wafer carrier present at the wafer transfer station.

2. The pod-load/unload and mass-transfer system of claim 1 wherein said carrier load mechanism reorients the wafer carrier while transferring the wafer carrier between the pod loader interface and the wafer transfer station.

3. The pod-load/unload and mass-transfer system of claim 2 wherein said carrier load mechanism for transferring and reorienting the wafer carrier, includes an end-effector that:

rotates in a first direction about a horizontal axis to engage the wafer carrier then disposed in said pod loader interface with wafers received in the wafer carrier being oriented horizontally;

raises the wafer carrier;

carrying the wafer carrier, rotates about the horizontal axis in a second direction that is reversed from the first direction so that wafers present in said wafer carrier become oriented vertically over the mass-transfer machine, and lowers to deposit the wafer carrier onto said mass-transfer machine.

4. The pod-load/unload and mass-transfer system of claim 1 wherein said elevator is U-shaped.

5. The pod-load/unload and mass-transfer system of claim 1 wherein the mass-transfer machine is directly coupled to said pod loader interface by a rigid plate that receives both the mass-transfer machine and the pod loader interface.

6. The pod-load/unload and mass-transfer system of claim 5 wherein the plate includes an indexing means for ensuring precise mechanical positioning and repositioning of the pod loader interface with respect to said mass-transfer machine so that the pod loader interface may be removed and replaced precisely in a fast and easy manner.

7. The pod-load/unload and mass-transfer system of claim 6 wherein the indexing means includes holes that pierce both the plate and a base plate of said pod loader interface, together with pins that are received into the holes, each pin extending between the plate and the base plate of said pod loader interface.

8. The pod-load/unload and mass-transfer system of claim 5 wherein the plate is received by guide rails that are coupled to the wafer transfer station, the guide rails permitting the pod-load/unload and mass-transfer system to slide horizontally with respect to the wafer transfer station to facilitate maintenance or repair thereof.

9. The pod-load/unload and mass-transfer system of claim 8 further comprising adjusting means disposed between the plate and the wafer transfer station for raising, lowering and tilting the pod-load/unload and mass-transfer system with respect to the wafer transfer station.

10. The pod-load/unload and mass-transfer system of claim 4 wherein the adjusting means includes jack screws that are coupled to the plate.

11. The pod-load/unload and mass-transfer system of claim 5 further comprising adjusting means disposed between the plate and the wafer transfer station for raising, lowering and tilting the pod-load/unload and mass-transfer system with respect to the wafer transfer station.

12. The pod-load/unload and mass-transfer system of claim 11 wherein the adjusting means includes jack screws that are coupled to the plate.

13. An integrated pod-load/unload and mass-transfer system for automatically transferring wafers between a pod and a carrier used in wafer processing; the pod including:

a wafer carrier adapted to receive a plurality of wafers;

a base which receives the wafer carrier; and a pod cover which mates with and seals to the base of the pod thereby enclosing the wafer carrier and any wafers received therein within the pod cover and the base; the pod-load/unload and mass-transfer system comprising:

pod loader interface adapted for receiving the pod, for exposing a wafer carrier initially enclosed within the pod, and for reenclosing the wafer carrier within the pod, said pod loader interface including a bulkhead that is pierced by a window;

a carrier load mechanism that is mechanically coupled to said pod loader interface and is supported from the bulkhead, a portion of said carrier load mechanism entering into and withdrawing out of the window of the bulkhead while said carrier load mechanism transfers the wafer carrier between a position in which the wafer carrier is exposed within said pod loader interface and a wafer transfer station; and a mass-transfer machine that includes the wafer transfer station and which is mechanically coupled directly to said pod loader interface, said mass-transfer machine including:

a retainer assembly positioned over the wafer carrier when the wafer carrier is present at the wafer transfer station, said retainer assembly including moveable retainers adapted for receiving wafers; and an elevator that is both:
- extensible for transferring wafers between a wafer carrier present at the wafer transfer station and a position within said retainer assembly in which the retainers thereof may receive the wafers; and
- retractable for transferring wafers between the retainers of the retainer assembly which have received wafers and a wafer carrier present at the wafer transfer station.

14. The pod-load/unload and mass-transfer system of claim 13 wherein said carrier load mechanism reorients the wafer carrier while transferring the wafer carrier between the pod loader interface and the wafer transfer station.

15. The pod-load/unload and mass-transfer system of claim 14 wherein said carrier load mechanism for transferring and reorienting the wafer carrier, includes an end-effector that:
- rotates in a first direction about a horizontal axis to engage the wafer carrier then disposed in said pod loader interface with wafers received in the wafer carrier being oriented horizontally;
- raises the wafer carrier;
- carrying the wafer carrier, rotates about the horizontal axis in a second direction that is reversed from the first direction so that wafers present in said wafer carrier become oriented vertically over the mass-transfer machine, and
- lowers to deposit the wafer carrier onto said mass-transfer machine.

16. The pod-load/unload and mass-transfer system of claim 13 wherein said elevator is U-shaped.

17. The pod-load/unload and mass-transfer system of claim 13 wherein the mass-transfer machine is directly coupled to said pod loader interface by a rigid plate that receives both the mass-transfer machine and the pod loader interface.

18. The pod-load/unload and mass-transfer system of claim 17 wherein the plate includes an indexing means for ensuring precise mechanical positioning and repositioning of the pod loader interface with respect to said mass-transfer machine so that the pod loader interface may be removed and replaced precisely in a fast and easy manner.

19. The pod-load/unload and mass-transfer system of claim 18 wherein the indexing means includes holes that pierce both the plate and a base plate of said pod loader interface, together with pins that are received into the holes, each pin extending between the plate and the base plate of said pod loader interface.

20. The pod-load/unload and mass-transfer system of claim 17 wherein the plate is received by guide rails that are coupled to the wafer transfer station, the guide rails permitting the pod-load/unload and mass-transfer system to slide horizontally with respect to the wafer transfer station to facilitate maintenance or repair thereof.

21. The pod-load/unload and mass-transfer system of claim 20 further comprising adjusting means disposed between the plate and the wafer transfer station for raising, lowering and tilting the pod-load/unload and mass-transfer system with respect to the wafer transfer station.

22. The pod-load/unload and mass-transfer system of claim 21 wherein the adjusting means includes jack screws that are coupled to the plate.

23. The pod-load/unload and mass-transfer system of claim 11 further comprising adjusting means disposed between the plate and the wafer transfer station for raising, lowering and tilting the pod-load/unload and mass-transfer system with respect to the wafer transfer station.

24. The pod-load/unload and mass-transfer system of claim 23 wherein the adjusting means includes jack screws that are coupled to the plate.

* * * * *